United States Patent [19]

Ito et al.

[11] 4,266,985
[45] May 12, 1981

[54] PROCESS FOR PRODUCING A SEMICONDUCTOR DEVICE INCLUDING AN ION IMPLANTATION STEP IN COMBINATION WITH DIRECT THERMAL NITRIDATION OF THE SILICON SUBSTRATE

[75] Inventors: Takashi Ito, Kawasaki; Shinpei Hijiya, Sagamihara, both of Japan

[73] Assignee: Fujitsu Limited, Kawasaki, Japan

[21] Appl. No.: 40,407

[22] Filed: May 18, 1979

[51] Int. Cl.³ .................... H01L 21/265; H01L 21/31
[52] U.S. Cl. ........................................ 148/1.5; 29/571; 29/578; 148/187; 357/23; 357/54; 357/91; 427/94; 427/255.1; 427/255.4
[58] Field of Search .................... 148/1.5, 187; 427/94, 427/255.1, 255.2, 255.4, 255.7; 357/23, 54, 91; 29/571, 578

[56] References Cited

U.S. PATENT DOCUMENTS

| | | | |
|---|---|---|---|
| 3,421,936 | 1/1969 | Vogel | 427/94 |
| 3,520,722 | 7/1970 | Scott | 427/94 |
| 3,798,061 | 3/1974 | Yamazaki | 427/255.4 X |
| 3,891,468 | 6/1975 | Ito et al. | 148/1.5 |
| 3,924,024 | 12/1975 | Naber et al. | 427/94 |
| 3,959,025 | 5/1976 | Polinsky | 357/54 X |
| 4,105,805 | 8/1978 | Glendinning et al. | 427/94 X |
| 4,113,515 | 9/1978 | Kooi et al. | 148/187 X |
| 4,170,502 | 10/1978 | Watakabe | 148/187 X |

FOREIGN PATENT DOCUMENTS 51-99980  3/1976  Japan .......................... 357/54

OTHER PUBLICATIONS

Spielmann et al., "Nitrogen Reactions on Silicon Wafers" I.B.M. Tech. Discl. Bull., vol. 10, No. 3, Aug. 1967, p. 333.

Primary Examiner—R. Dean
Assistant Examiner—W. G. Saba
Attorney, Agent, or Firm—Staas & Halsey

[57] ABSTRACT

Impurity ions implanted into a semiconductor silicon substrate are not redistributed during a heating of the substrate from the substrate to the film. Such redistribution does not occur due to the direct nitridation of the silicon substrate for forming the silicon nitride film.

16 Claims, 6 Drawing Figures

PROCESS FOR PRODUCING A SEMICONDUCTOR DEVICE INCLUDING AN ION IMPLANTATION STEP IN COMBINATION WITH DIRECT THERMAL NITRIDATION OF THE SILICON SUBSTRATE

BACKGROUND OF THE INVENTION

1. Field of the Invention

The present invention relates to a process for producing a semiconductor device including an ion implantation step and, more particularly, to the process mentioned above suitable to be applied for the production of an MIS type FET, in which production an impurity concentration in the channel of the MIS type FET (hereinafter referred to as MISFET) is controlled by ion implantation.

2. Description of the Prior Art

Ion implantation is a standard technique for the surface doping of a semiconductor and comprises an introduction of atoms into the surface layer of a solid semiconductor substrate by bombardment of the semiconductor substrate with ions having an energy in the range of KeV to MeV. The previous diffusion method is being partly replaced by the ion implantation method, since the ion implantation method has the advantages of an externally controlled, non equilibrium process, whereas the diffusion process is dominated by unchangeable physical conditions, such as the diffusion constant of the impurity in the semiconductor material.

It is known in the ion implantation technique that the implanted atoms become electrically active only after heating the ion implanted, semiconductor material at a temperature of approximately 1000° C., over a period of approximately 30 minutes. Damage to the atomic arrangement of the semiconductor material is also provoked by ion implantation, but can be remedied by such heating as mentioned above.

Since the ion implantation is carried out under a high energy, non equilibrium condition, the concentration of the implanted ion is maximum at the interior of the semiconductor which is referred to as the projected range ($R_p$) or mean depth of penetration. The projected range ($R_p$), and thus the impurity concentration, can be precisely varied by the energy of the ion beam. Accordingly, the ion implantation is suited for precisely controling a concentration of impurities having one conductivity type and to be contained in active regions of bipolar transistors, MISFETs and the like.

It is known in the field of semiconductor technology that the ions, frequently boron ions, are implanted through an insulative, thermally oxidized film on a semiconductor substrate under such an ion energy that the ions are implanted below the oxide film. An important purpose of applying the ion implantation mentioned above is a so called "channel doping", wherein the threshold voltage of the channel of MISFETs is adjusted by the ion implanted concentration in such channel. The known process of ion implantation was, however, disadvantageous because of the oxide film used as the insulation film, in the fact that the implanted boron ions are drawn out of the semiconductor substrate into the oxide film after the heating mentioned above, with the consequence that the impurity concentration at the surface of the semiconductor substrate is reduced to a level considerably lower than the required level. This is due to the fact that the distribution constant of the boron ions in the oxide film is high, and hence, a large amount of the boron ions are redistributed into the oxide film. Accordingly, it was not possible by means of the known channel doping process to obtain a desired value of threshold voltage.

SUMMARY OF THE INVENTION

The present inventors were engaged in the research and development of very thin nitride films grown by direct thermal reaction with nitrogen, and discovered that the drawbacks of the redistribution of the implanted ions mentioned above can be effectively eliminated by the silicon nitride film formed by direct, thermal nitridation of the semiconductor silicon.

It is, therefore, an object of the present invention to provide a process including an ion implantation step, wherein the redistribution of the implanted ions from the semiconductor substrate to the insulation film during the heat treatment after ion implantation can be essentially prevented.

It is another object of the present invention to provide a process including an ion implantation step, wherein a reduction of the surface concentration of the implanted ions can be prevented.

It is also an object of the present invention to precisely adjust the surface concentration of implanted impurities and the threshold voltage of MISFETs, and to uniformly distribute the implanted impurities over the surface of a semiconductor substrate.

It is yet another object of the present invention to provide a process for producing, by means of the ion implantation technique, an E/D mode, MIS type IC, wherein a driver element of the IC comprises an enhancement type MISFET and a load element of the IC comprises a depletion type MISFET. In such IC, FETs having different threshold voltages are included in one circuit element and, therefore, the precise adjustment of the surface concentration of the impurities is indispensable.

It is still another object of the present invention to use a silicon nitride film for the insulation film of MISFETs and for preventing the redistribution of the implanted impurity during the heat treatment after ion implantation.

The process according to the present invention comprises the steps of:
- forming a silicon nitride film by direct thermal nitridation of the silicon of a semiconductor silicon substrate;
- implanting impurity ions into the semiconductor silicon substrate, and;
- heating the semiconductor substrate to a temperature for electrically activating the impurity ions and for correcting the damage to the semiconductor substrate caused by the ion implantation, while maintaining essentially the entire amount of the implanted impurities at the surface of the semiconductor silicon substrate;
- depositing a conductive material film over the silicon nitride film;
- selectively removing the conductive material film and said silicon nitride film, and forming windows through these films, the windows exposing portions of the ion implanted surface of the semiconductor silicon substrate, and;
- diffusing impurities into the semiconductor silicon substrate, while maintaining essentially the entire amount of the ion implanted impurities at the semiconductor substrate surface below the remaining silicon nitride film.

Silicon nitride film has been produced mainly by a CVD (chemical vapor deposition) process, wherein a silicon bearing, gaseous material, such as $SiH_4$, is brought into contact with ammonia. Silicon nitride film formed by the CVD process is used for the insulation film of MISFETs and the surface protection film of IC. The Inventors of the present invention have discovered that a film formed by thermal nitridation of the silicon substrate, namely a silicon nitride film, in which the silicon of the substrate is directly nitrided, effectively prevents redistribution of the implanted ions from the semiconductor surface into the nitride film. The silicon nitride film mentioned above is hereinafter referred to as a direct thermal nitride film of silicon. The surface concentration of the implanted impurities in terms of the average concentration in the implanted area of the silicon substrate decreases during the heating step previously mentioned in an amount of less than 50% preferably 20%, based on the implanted amount of the ions.

The process for forming direct thermal nitride film of silicon, which can prevent the redistribution of an implanted ion, comprises a step of heating a silicon semiconductor substrate in a nitrogen containing atmosphere to a temperature of from 900° to 1300° C., preferably from 1000° to 1200° C. The nitrogen containing atmosphere may comprise nitrogen or a nitrogen compound, such as ammonia or hydrazine ($N_2H_4$). The nitrogen compound is preferably ammonia.

A preferable, direct thermal nitride film of silicon for the prevention of the impurity redistribution can be formed by using the nitridation atmosphere, in which oxidant impurities, such as oxygen, water, carbon dioxide, etc., are reduced to a level of less than 1 ppm and by adjusting the nitridation temperature in the range of from 1200° to 1300° C. The nitridation atmosphere may comprise an inert gas such as argon, in addition to the nitrogen and/or a nitrogen-containing gas.

It is preferable to completely clean the silicon substrate prior to the nitridation, by degreasing the silicon substrate in an organic solvent, boiling in a acid solution, preferably sulfuric and nitric acid, and etching in hydrofluoric acid.

Prior to forming the direct thermal nitride film of silicon, it is preferable to heat the silicon substrate in an inert gas atmosphere at temperature of from 900° to 1300° C.

An average relative dielectric constant of the direct thermal nitride film of silicon is almost 50% larger than that of thermal oxidation film of silicon. Electric properties other than the relative dielectric properties of the direct thermal nitride film of silicon are similar or superior to those of the silicon nitride film formed by the CVD process, as shown in Table 1, below. The direct thermal nitride film of silicon can, therefore, be used for the gate insulation film of MISFETs.

TABLE 1

| | CVD | Direct Nitridation |
|---|---|---|
| Maximum Electric Field | 0.1–5 MV/cm | 10.55 MV/cm |
| Fixed Charge per Unit Area (Qss) | $5 \times 10^{11}$–$10^{13}$/cm² | less than $5 \times 10^{11}$ charges/cm² |
| Dielectric Constant | 5.0–6.0 | 6.0 |

TABLE 1-continued

| | CVD | Direct Nitridation |
|---|---|---|
| (ε) | | |

The direct thermal nitride film of silicon exhibits remarkable masking effects against, for example, acid, organic solvent and oxidation. Accordingly, the interface between the direct thermal nitride film of silicon and the silicon substrate cannot be contaminated by an etching or cleaning solution used after the ion implantation, for cleaning various films formed during the production of MISFETs, while the silicon nitride film formed by CVD process cannot effectively prevent such contamination.

The direct thermal nitride film of silicon is as dense as the densest CVD film. Because of the high density and masking effects the direct thermal nitride film of silicon can advantageously prevent infiltration of sodium ions, etc., from a silicon dioxide film into the interface between the silicon nitride film and the silicon substrate.

The inventors discovered the above mentioned conspicuous properties of the direct thermal nitride film of silicon, which properties, however, cannot explain why the redistribution of the implanted impurities from the silicon substrate to the silicon nitride film is prevented. As previously described, impurities present on the surface of the silicon substrate are considerably redistributed into the silicon dioxide film after the heat treatment. Such redistribution tendency after heat treatment at 1200° C. in a dry oxygen atmosphere is expressed by the formula:

$$Ns/Nb \approx 0.04,$$

wherein Ns and Nb designate the concentration of impurities, i.e. borons, at the surface and the portion not including the surface of the silicon substrate, respectively. Accordingly, when the silicon substrate is provided with a silicon dioxide film and has an Nb value of $1 \times 10^{16}$/cm³, the concentration of boron at the surface of the silicon substrate (Ns) is reduced to $4 \times 10^{14}$/cm³ after the heat treatment mentioned above. On the other hand, when the direct thermal nitride film of silicon is formed on the silicon substrate according to the present invention, the ration Ns/Nb is advantageously higher than approximately 0.7. Accordingly, redistribution of impurities is negligible as compared with that occurring between the silicon substrate and the silicon dioxide film. The redistribution of impurities is also negligible when heating the silicon substrate with the direct thermal nitride film of silicon in a hydrogen atmosphere, while such redistribution is considerable when heating the silicon substrate with the silicon dioxide in the hydrogen atmosphere.

The direct thermal nitride film of silicon used for the gate of MISFETs and for passing the ions of implantation according to the channel doping technique has preferably a thickness in the range of from 20 to 100 angstroms. Ions to be implanted have an energy in the range of from 20 to 400 KeV, depending upon the threshold voltage of the channel of the MISFET. This energy is advantageously low due to a small thickness of the silicon nitride film. As a result of the ion implantation at the ion energy mentioned above through the direct thermal nitride film having the above mentioned thickness, the threshold voltage set by the amount of implanted ions is not reduced by the redistribution of the ions during the previously mentioned heating. When the thickness of the silicon nitride film mentioned above is not sufficient for the thickness of a gate insulation film, it is necessary to form on the direct thermal nitride film of silicon, an additional insulation film of silicon dioxide or silicon nitride, by the CVD technique. When the thickness of the silicon nitride is from 20 to 100 angstroms, a conductive material consisting, for example, of a doped polycrystalline silicon, can be directly formed on the direct thermal nitride film of silicon and can be used as a gate electrode of MISFETs. The silicon nitride can act as an excellent mask against the diffusion of impurities contained in the gate electrode into the semiconductor substrate.

Preferable conditions for adjusting the threshold voltage (Vth) are as follows.

A. Threshold Voltage Control of enhancement type MISFET
   (1) Resistivity of P type Silicon substrate: 0.1 to 30 ohm·cm.
   (2) Thickness of the direct thermal nitride film of silicon: 20 to 100 angstroms.
   (3) boron ion energy: 20 to 400 KeV.
   (4) Implanted amount of impurities having P conductivity type: $10^{15}$ to $10^{18}/cm^3$.
   (5) Vth: 0 to 1 volts.

B. Threshold voltage control of the depletion type MISFET
   (1) Resistivity of P type Silicon substrate: 0.1 to 30 ohm·cm.
   (2) Thickness of the direct thermal, nitride film of silicon: 20 to 100 angstroms.
   (3) Arsenic ion energy: 30 to 400 KeV.
   (4) Implanted amount of impurities having N conductivity: $10^{15}$ to $2\times10^{18}/cm^3$.
   (5) Vth: $-3$ to 0 volts.

The heating after the ion implantation step may be carried out simultaneously with a subsequent thermal diffusion step for doping impurities, for example, into the gate electrode or the source and drain regions of the MISFETs.

In the production of the E/D mode MIS type ICs mentioned previously, the E mode and D mode MISFETs are produced by ion implanting usually boron and phosphorus ions, respectively, in such a manner that one of these mode MISFETs is selectively exposed by a masking film. The impurity ions may be implanted solely through the direct thermal nitride film of silicon, as stated above, and also, may be implanted through such nitride film of silicon and a conductive film deposited on the nitride film of silicon. The conductive film consists of aluminum, polycrystalline silicon and other metals, preferably polycrystalline silicon, and is used for the gate electrode of the MISFETs. The ion implantation through the nitride and conductive films mentioned above is more advantageous than the ion implantation solely through the nitride film, in the light of the fact that the slight removal of the thin direct thermal nitride film of silicon, which would occur during cleaning of the silicon nitride film in the latter ion implantation, can be prevented by the conductive film. The ion energy of impurities implanted through the nitride film and conductive films should be adjusted to a high level in the above mentioned range, i.e. from 20 to 400 KeV, depending upon the kind and thickness of the conductive film for the gate electrode.

The direct thermal nitride of silicon, which passes the impurity ions, can increase the production yield or recovery of semiconductor devices, because electric charges induced on the silicon nitride film by the ion implantation are decreased due to the direct thermal nitridation. As a result, damage to or breaking of the silicon nitride film is decreased due to the decrease in the electric charges.

The impurity ions may be implanted indirectly into the silicon substrate through the direct thermal nitride film of silicon or both through such nitride film and a conductive film, as stated above. However, the impurity ions may be directly implanted into the silicon substrate and the direct thermal nitride film of silicon can be subsequently formed on the ion implanted substrate of silicon. During subsequent heat treatment for activating the directly implanted impurities and correcting damage to the silicon substrate, as well as heat treatment after the indirect ion implantation into the silicon substrate, the direct thermal nitride film can prevent the redistribution of the impurities.

The process according to the present invention is preferably used for the production of the MIS type ICs, because the impurities below the gate electrode of the MIS type ICs can be strictly controlled. However, conventional processes for ion implanting through the silicon nitride film, for example, the production processes of circuit elements in bipolar integrated circuits or individual elements, such as transistors, and diodes, can also be replaced by the process according to the present invention.

BRIEF DESCRIPTION OF THE DRAWINGS

The present invention will be explained in detail hereinafter by way of examples illustrated in the drawings, wherein.

DESCRIPTION OF THE PREFERRED EMBODIMENTS

EXAMPLE 1

Figure 1:
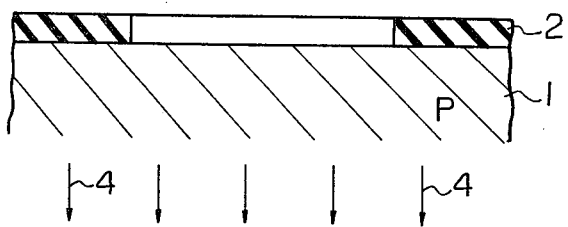
FIGS. 1 through 5 illustrate cross sectional views of a semiconductor silicon substrate with various elements of an MISFET formed thereon.

Referring to FIG. 1, a P type semiconductor silicon substrate 1, having a resistivity of 20 ohm cm was provided with an insulation film 2 made of silicon dioxide ($SiO_2$) and having a thickness of a few thousand angstroms. A window was formed through the insulation film 2 so as to expose a surface portion of the substrate 1 on which one MISFET was to be produced. The exposed surface of the silicon substrate through the window of the insulation film 2 was cleaned by dipping the entire substrate into a solution of HF.

The substrate 1 as shown in FIG. 1 was heated to a temperature of approximately 1200° C., in an atmosphere containing 100% ammonia. The exposed surface of the silicon substrate 1 was directly nitrided by the ammonia containing atmosphere. The insulation film 2 was used as the nitridation mask. A silicon nitride film 3 (FIG. 2), having a thickness of 100 angstroms, was formed at the surface portion of the exposed silicon substrate within the window. In other words, nitrogen of the atmosphere was impregnated into the silicon substrate 1, while a nitride forming reaction occurred during the impregnation.

Figure 2:
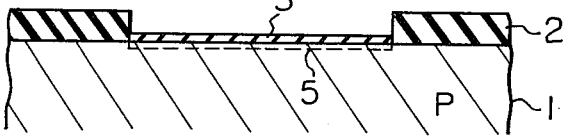

Subsequently, beams of boron ions ($B^{30}$) denoted as "4" in FIG. 2, were ion implanted at an energy of approximately 40 KeV into the silicon semiconductor through the thin silicon nitride film 3. The thick insulation film 2 masked the underlying silicon from the boron-ion implantation, so that the ion-implantation layer 5 was formed only below the thin silicon nitride film 2. The semiconductor silicon below the thick insulation layer 2 was used for the field region surrounding the MISFET element. The doping amount of the boron ions was $5 \times 10^{11}/cm^2$ of the ion-implantation layer 5.

The ion implanted substrate 1 of silicon was then subjected to a conventional heat treatment at a temperature of approximately 1000° C., for a period of 30 minutes. The purpose of the heat treatment was to electrically activate the ion implanted impurities and to restore or correct atomic arrangements of the ion implanted silicon substrate.

Figure 3:
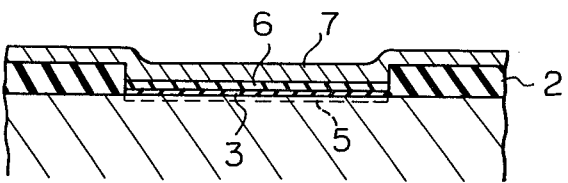

A silicon dioxide ($SiO_2$) film 6 (FIG. 3) was deposited on the silicon nitride film 5, by a known CVD process, to a thickness of 500 angstroms. The total thickness of the films 3 and 6 guaranteed the thickness required for the gate insulation film formed on the channel region of MISFET. The polycrystalline silicon film 7 for the gate electrode of the MISFET was subsequently deposited on the entire top surface of the silicon surface 1 by a known decomposition technique of monosilane, as shown in FIG. 3.

Figure 4:
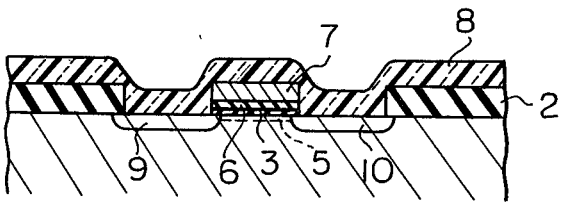
Figure 5:
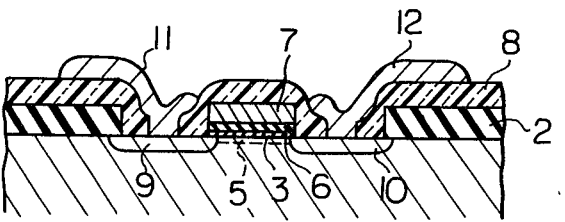

The steps of producing the MISFET illustrated in FIGS. 1 through 5 were carried out by a conventional technique. Referring to FIG. 4, the polycrystalline silicon film 7 and the gate insulation films 6 and 3 were selectively removed by a photoetching process, and a phosphosilicate glass (PSG) film 8 was deposited on the entire top surface of the substrate 1. The substrate 1 was heated to a temperature of approximately 1000° C. An N type impurity of phosphorus contained in the PSG film 8 was diffused during the heating into the silicon substrate 1, so as to form N type source and drain regions 9 and 10, respectively.

Windows were formed through the PSG film 8, and a portion of the source and drain regions 9 and 10, respectively, was exposed through each of the windows. Source and drain electrodes 11 and 12 were formed by vacuum depositing aluminum and, then, selectively removing the aluminum, so that an aluminum electrode pattern contacting the exposed regions mentioned above, was produced, as shown in FIG. 5.

The obtained threshold voltage was 1 volt.

EXAMPLE 2

The procedure of Example 1 was repeated, except that the polycrystalline silicon film 7 was directly deposited on the direct thermal nitride film of silicon 3. The energy of boron ions 4 was 25 KeV. The same threshold voltage as in Example 1 was obtained.

EXAMPLE 3

In this Example, the ion implantation was carried out after the formation of the polycrystalline silicon film 7 (FIG. 3) having a thickness of 3000 angstroms. The procedure followed in this Example was the same as that of Example 1 except for the following.

A. The polycrystalline silicon film 7 was directly deposited on the direct thermal nitride film of silicon 3 having a thickness of 90 angstroms.

B. The energy of boron ions was 170 KeV.

C. The dosing amount of boron ions was $5 \times 10^{11}/cm^2$.

The results of the production of MISFET were essentially the same as those in Example 1.

EXAMPLE 4

One piece of P type (100) silicon substrate having a resistivity of from 3 to 5 ohm cm was subjected to the direct formation of silicon nitride. The silicon substrate was immersed in a 40% solution of hydrofluoric acid and, then, completely dried in a nitrogen atmosphere. The dried silicon substrates were placed in a quartz tube, through which an argon gas was flowed. A gaseous mixture of 70% of argon gas and 30% of nitrogen gas was completely purified, so that the oxydant gases, such as $O_2$, $Co_2$, $H_2O$ etc., were reduced to a level of less than 1 ppm. This gaseous mixture was then flowed into the quartz tube at a rate of 5000 cc/min and contacted with the silicon substrate at a temperature of approximately 1200° C. A silicon nitride film grew on the silicon substrate to a thickness of 100 angstroms. Ions of boron ($B^+$) were implanted through the silicon nitrides at an ion energy of 40 KeV and amount of $5 \times 10^{13}/cm^2$. N+P junctions, which are separated from each other, were produced between the P type substrate and the N+ type layer ion implanted with boron. The silicon substrate, which was treated as mentioned above, was heated or annealed at 1100° C., for a period 30 minutes.

The avalanche breakdown voltage of the N+P junctions was 6.6 V±0.2 V.

Instead of the direct thermal nitride film of silicon, a silicon dioxide film of 100 angstrom thickness was formed on the silicon substrates mentioned above by a conventional thermal oxidation technique. The avalanche breakdown voltage of the $N^{30}$ P junctions produced by the ion implantation followed by the annealing mentioned above was 8.7 V±0.5 V.

The low avalanche breakdown voltage of the $N^{30}$ P junctions formed by the ion implantation through the direct thermal nitride film of silicon indicates that the surface concentration of boron is not reduced substantially after the annealing. The scatter of the breakdown voltage of the N+P junctions is smaller in the junctions according to the present invention than in those produced by ion implantation through the conventional oxide film. This fact indicates that the impurity ions are implanted into one piece of the silicon substrate through the direct thermal nitride film of silicon more uniformly than through the oxide film.

EXAMPLE 5

Silicon substrates on wafers were grouped into four lots, as shown in Table 2, in accordance with the boron concentration in the body of the substrates (Nb).

TABLE 2

| Lot No. | Nb (cm$^{-3}$) | Ns (cm$^{-3}$) | Ns/Nb (average) |
|---|---|---|---|
| 1 | 2.8~3.2 × 10$^{15}$ | 2.1~3.4 × 10$^{15}$ | 0.92 |
| 2 | 1.8~2.0 × 10$^{16}$ | 1.2~2.0 × 10$^{16}$ | 0.84 |
| 3 | 1.8~2.1 × 10$^{16}$ | 1.3~1.7 × 10$^{16}$ | 0.77 |
| 4 | 1.7 × 10$^{16}$ | 1.6~2.2 × 10$^{16}$ | 0.89 |

Each lot contained from 10 to 20 substrates.

The direct thermal nitride of silicon was formed on the substrates by heating them to 1200° C. for a period of 30 minutes. These substrates were then heated to a temperature of from 1000° to 1150° C., for 15 to 90 minutes, in an oxygen atmosphere.

The boron concentration at the substrate surface was measured after the heating mentioned above, and is shown in the column entitled "Ns" in Table 2. The ratios Ns/Nb of the substrates of each lot were averaged and are shown in Table 2. As is clear from the ratios Ns/Nb, the surface concentration of boron is not essentially redistributed into the silicon nitride due to the heat treatment, and further, the impurities, which were already present on the substrate surface pirior to the formation of the silicon nitride, are not redistributed into the silicon nitride.

EXAMPLE 6

The relationship between the surface concentration of boron (Ns) and the dosing amount of boron ions was investigated in the this Example under the following conditions.

Ion energy: 40 KeV

Thickness of direct thermal nitride film of silicon: 90 angstroms

Heating temperature after the formation of the silicon nitride film mentioned above: 1000°–1150° C.

Figure 6:
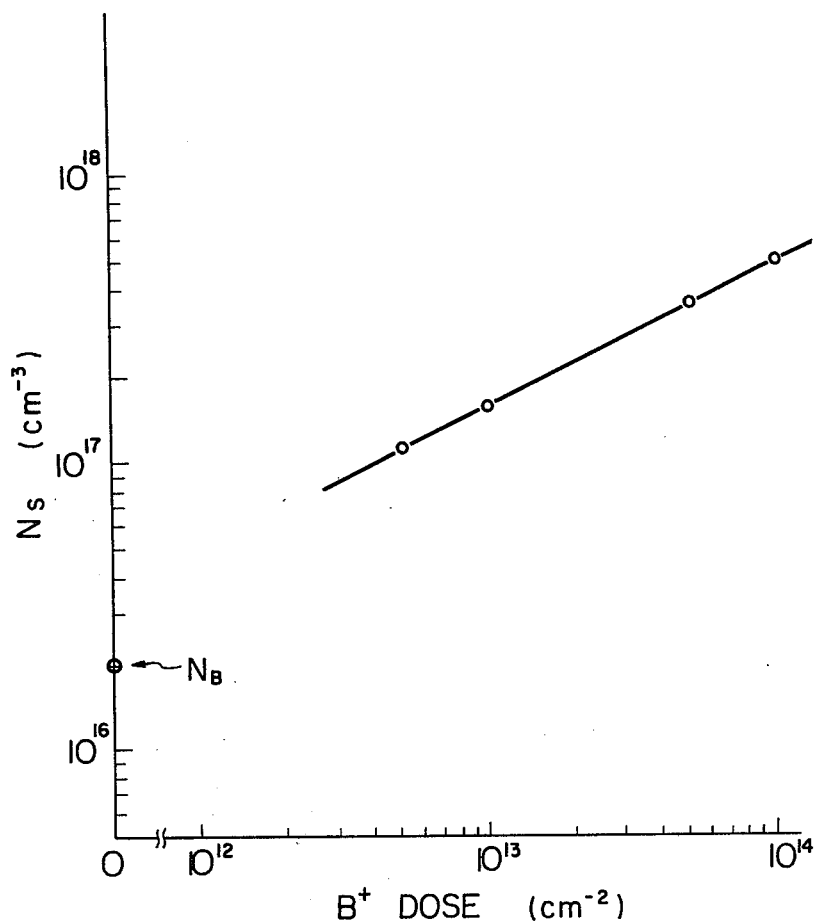
FIG. 6 is a graph indicating the relationship between the dosing amount and the surface concentration Ns of boron.

The relationship mentioned above is as shown in FIG. 6.

The Ns value is linearly dependent on the dosing amount and can be $10^{17}/cm^3$ or higher. The Ns value is approximately twice as high as that by ion implantation through the conventional oxide film.

What we claim is:

1. A process for producing a semiconductor device comprising the steps of:
    forming a silicon nitride film by direct thermal nitridation of the silicon of a semiconductor silicon substrate;
    implanting impurity ions into said semiconductor silicon substrate, and;
    heating said semiconductor substrate to a temperature for electrically activating said impurities and for correcting damage to said semiconductor substrate caused by the ion implantation, while maintaining essentially the entire amount of the ion implanted impurities at the surface of said semiconductor silicon substrate.

2. A process according to claim 1, wherein said impurity ions are implanted through said silicon nitride film.

3. A process according to claim 2, wherein said impurity ions are implanted through a conductive material film deposited on said silicon nitride film and then through said silicon nitride film.

4. A process according to claim 1, wherein said impurity ions are implanted directly into said semiconductor silicon substrate.

5. A process according to claim 1, 2, 3 or 4, wherein the thickness of said silicon nitride film is in the range of from 20 to 100 angstroms.

6. A process according to claim 5, wherein the thickness of said silicon nitride is in the range of from 50 to 90 angstroms.

7. A process according to claim 2, wherein the ion energy of said impurities is in the range of from 10 to 400 KeV.

8. A process according to claim 7, wherein said ion energy is in the range of from 20 to 200 KeV.

9. A process for producing a semiconductor device comprising MISFET elements comprising the steps of:
    forming an insulation film on the surface of a semiconductor silicon substrate;
    selectively removing said insulation film and forming windows through said insulation film, thereby exposing surface portions for forming each of said MISFET elements;
    cleaning said exposed surface portions with an acid solution;
    forming a silicon nitride film by direct thermal nitridation of the silicon of said exposed surface portions of said semiconductor silicon substrate;
    implanting impurity ions into said semiconductor silicon substrate;
    heating said semiconductor substrate to a temperature for electrically activating said impurities and for correcting damage to said semiconductor substrate caused by the ion implantation, while maintaining essentially the entire amount of the ion implanted impurities at the surface of said semiconductor silicon substrate;
    depositing a conductive material film over said silicon nitride film;
    selectively removing said conductive material film and said silicon nitride film, and forming windows through these films, said windows exposing portions of the ion implanted surface of said semiconductor silicon substrate, and;
    diffusing impurities into said semiconductor silicon substrate, while maintaining essentially the entire amount of the ion implanted impurities at the semiconductor substrate surface below the remaining silicon nitride film.

10. A process according to claim 8, wherein said impurity ions are implanted through said silicon nitride film.

11. A process according to claim 10, wherein said impurity ions are implanted through a conductive material film deposited on said silicon nitride film and then said silicon nitride film.

12. A process according to claim 8, wherein said impurity ions are implanted directly into said semiconductor silicon substrate.

13. A process according to claim 9, 10, 11 or 12, wherein the thickness of said silicon nitride film is in the range of from 20 to 100 angstroms.

14. A process according to claim 13, wherein the thickness of said silicon nitride is in the range of from 50 to 90 angstroms.

15. A process according to claim 9, 10, 11 or 12, wherein the ion energy of said impurities is in the range of from 10 to 400 KeV.

16. A process according to claim 15, wherein said ion energy is in the range of from 20 to 200 KeV.

* * * * *

UNITED STATES PATENT AND TRADEMARK OFFICE
CERTIFICATE OF CORRECTION

PATENT NO. : 4,266,985

DATED : May 12, 1981

INVENTOR(S) : Ito et al.

It is certified that error appears in the above-identified patent and that said Letters Patent is hereby corrected as shown below:

Column 3, line 42, "a" should be --an--.

Column 7, line 1, "($B^{30}$)" should be --($B^+$)--.

Column 8, line 37, "$N^{30}P$" should be --$N^+P$--;

line 40, "$N^{30}P$" should be --$N^+P$--.

Column 9, line 11, "pirior" should be --prior--.

Signed and Sealed this
First Day of December, 1987

Attest:

DONALD J. QUIGG

*Attesting Officer*  *Commissioner of Patents and Trademarks*